United States Patent [19]

Furuyama et al.

[11] Patent Number: 5,221,984
[45] Date of Patent: Jun. 22, 1993

[54] OPTICAL DATA TRANSMISSION DEVICE WITH PARALLEL CHANNEL PATHS FOR ARRAYED OPTICAL ELEMENTS

[75] Inventors: Hideto Furuyama, Tokyo; Masaru Nakamura, Kawaguchi, both of Japan

[73] Assignee: Kabushiki Kaisha Toshiba, Kawasaki, Japan

[21] Appl. No.: 582,336

[22] Filed: Sep. 14, 1990

[30] Foreign Application Priority Data

Sep. 18, 1989 [JP] Japan .................................. 1-239893
Sep. 29, 1989 [JP] Japan .................................. 1-254939
Oct. 31, 1989 [JP] Japan .................................. 1-283731

[51] Int. Cl.$^5$ ...................... H04B 10/00; H04B 10/12
[52] U.S. Cl. ............................. 359/154; 359/173; 385/89; 333/28 R
[58] Field of Search ............... 359/118, 125, 137, 154, 359/173, 140, 164; 372/50; 385/2, 14, 89; 357/30 Q, 30 H, 68; 174/261; 361/409, 410, 395; 333/1, 28 R, 136, 139, 156; 455/139; 371/1

[56] References Cited

U.S. PATENT DOCUMENTS

| | | | |
|---|---|---|---|
| 3,777,149 | 12/1973 | Marcatili | 250/209 |
| 4,079,404 | 3/1978 | Comerford et al. | 357/19 |
| 4,289,384 | 9/1981 | Samek | 174/261 |
| 4,583,096 | 4/1986 | Bellman et al. | 343/368 |
| 4,671,605 | 6/1987 | Soref | 385/2 |
| 4,756,590 | 7/1988 | Forrest et al. | 350/96.15 |
| 4,897,671 | 1/1990 | Mahapatra et al. | 385/14 |
| 4,931,753 | 6/1990 | Nelson et al. | 333/139 |

OTHER PUBLICATIONS

Patent Abstracts of Japan, vol. 13, No. 196 (E-755) [3544], May 10, 1989 & JP-A-1 18 337 (NEC) Jan. 23, 1989.
Journal of Lightwave Technology, vol. LT-5, No. 8, Aug. 1987, pp. 1118-1122, New York, US; O. Yusuke et al, "Twelve-Channel Individually Addressable InGaAs/InP p-i-n Photodiode and InGaAsP/InP LED Arrays in a Compact Package".
Optical Fiber Communication Conference (OFC'89) Technical Digest TV-D3, "Twelve-channel parallel optical fiber transmission using a low-drive-current 1.3 μm LED array and a PIN PD array" K. Kaede et al.: Feb. 6, 1989 (Houston, Texas).
1988 Autumn National Convention Record, the Institute of Electronics, Information and Communication Engineers, Electronics Group [PARTC-1], C-220, "PIN photodiode array for optical parallel interface" K. Junyaprasert et al; Aug. 15, 1988.

*Primary Examiner*—Edward L. Coles, Sr.
*Assistant Examiner*—R. Bacares
*Attorney, Agent, or Firm*—Oblon, Spivak, McClelland, Maier & Neustadt

[57] ABSTRACT

A parallel optical data transmission device has an optical signal emitting unit, an optical signal reception unit and a parallel optical signal transmission cable for optically coupling therebetween. The optical signal emitting unit has an array of semiconductor lasers, whereas the reception unit has an array of semiconductor photodetectors of the same number. The transmission cable essentially consists of optical fibers bundled together. In the optical signal emitting unit, electrical drive signal transfer lines for the lasers have a stair-step bending pattern such that their transmission lengths sequentially vary. In the optical reception unit, electrical signal transmission lines for the photodetectors likewise has a stair-step bending pattern such that their transmission lengths sequentially differ, this stair-step pattern is like a reversed version of the stair-step pattern in the optical signal emitting unit, whereby the total lengths of electrical signal transmission line paths are made equal to one another for the respective transmission channels, thus ensuring compensation for a delay in parallel signal transmission.

11 Claims, 7 Drawing Sheets

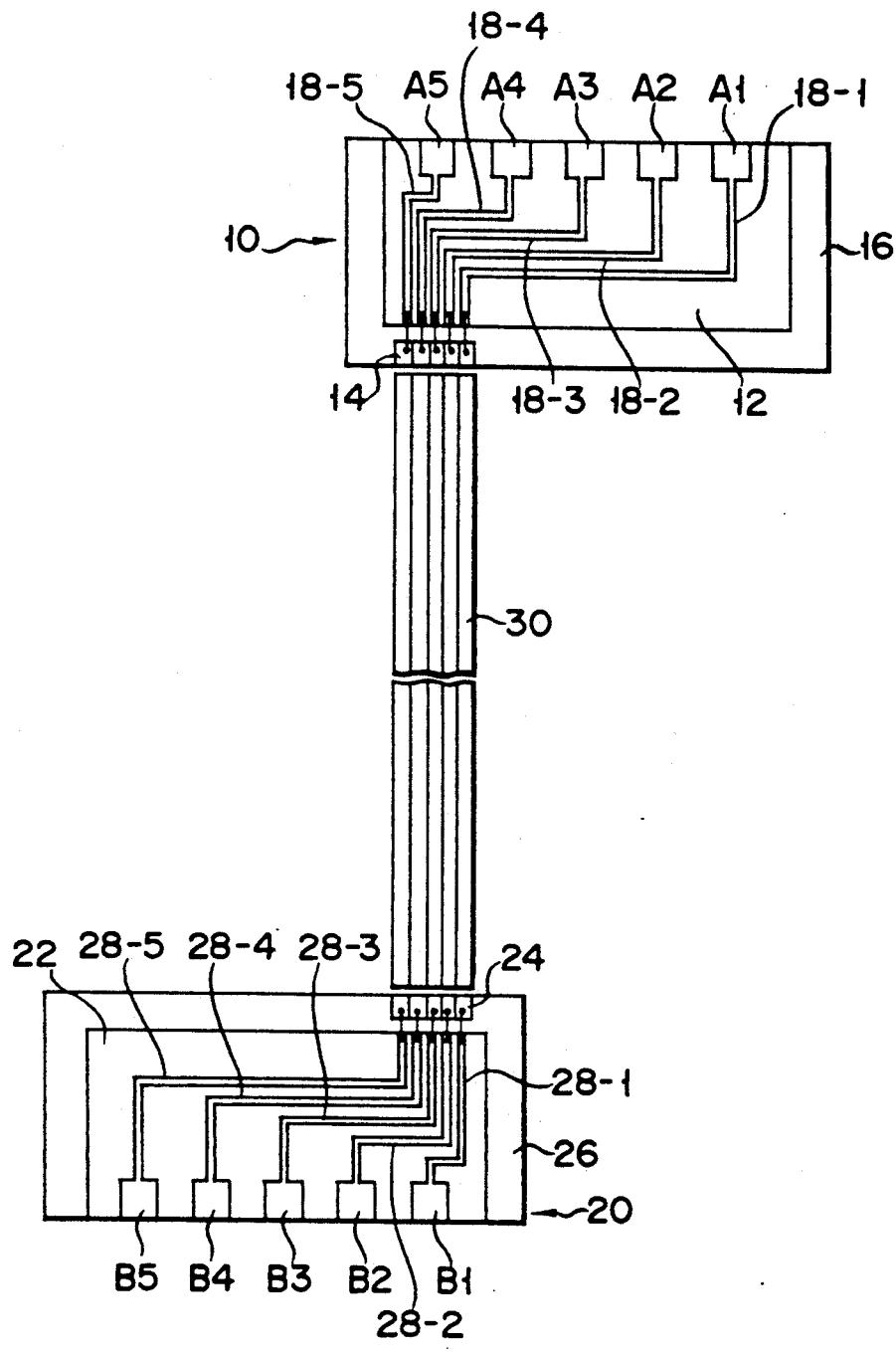
F I G. 1

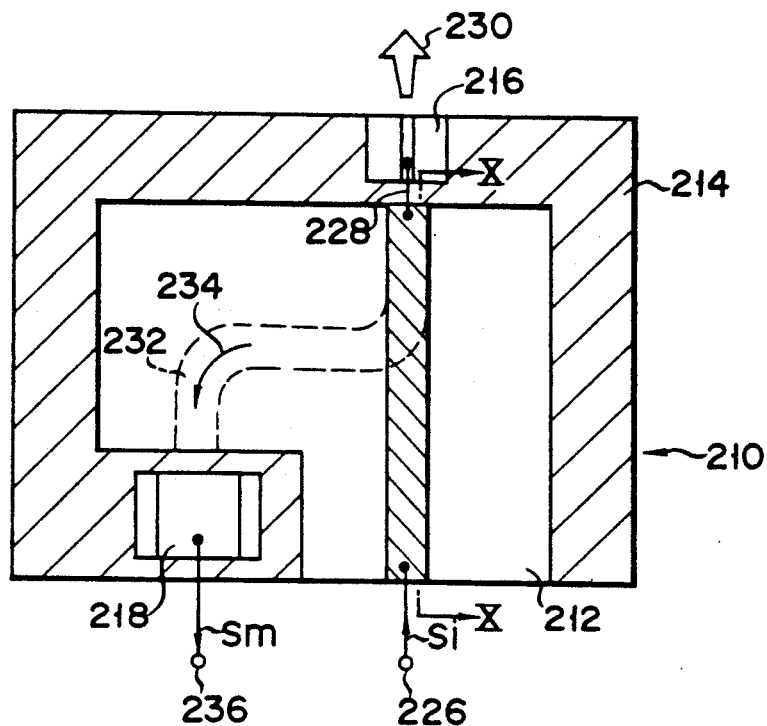
F I G. 8
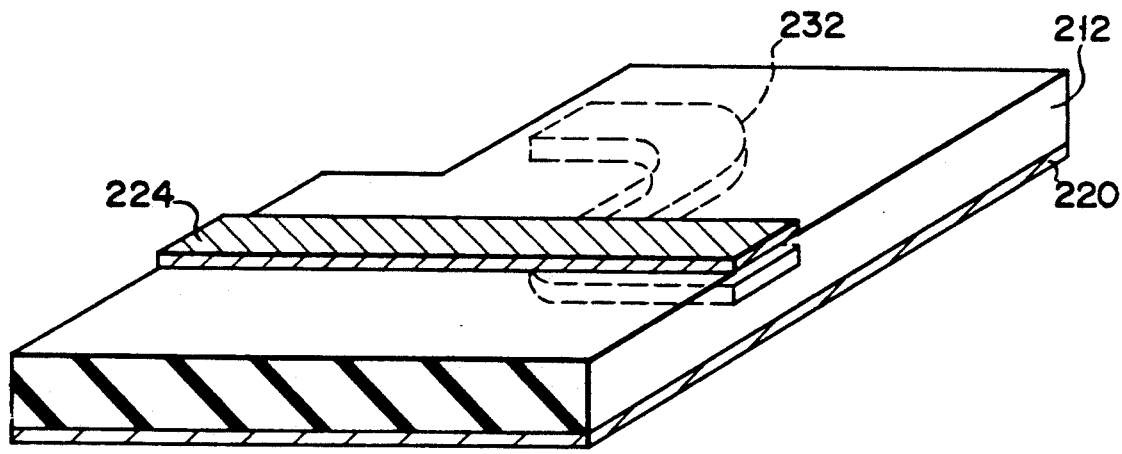
F I G. 9

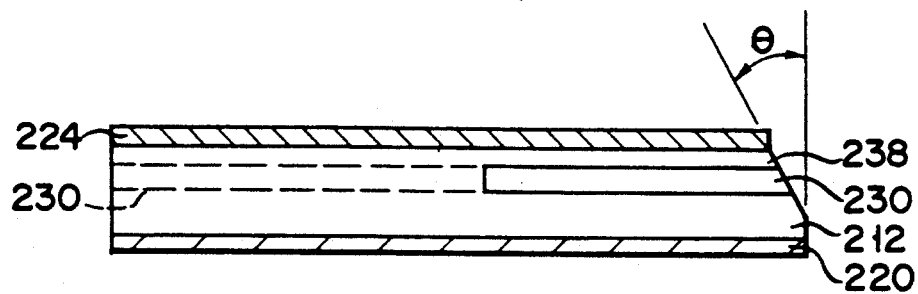
F I G. 10
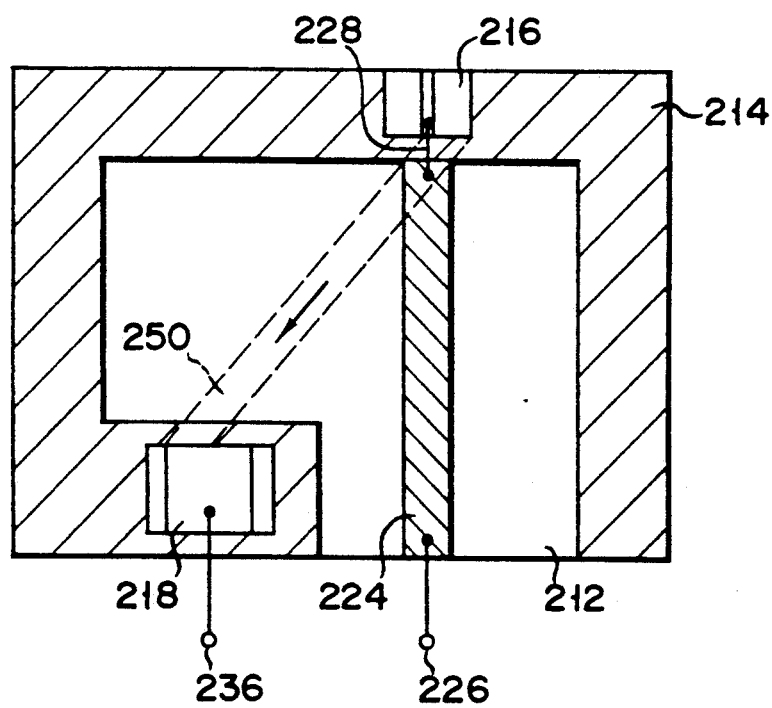
F I G. 11

OPTICAL DATA TRANSMISSION DEVICE WITH PARALLEL CHANNEL PATHS FOR ARRAYED OPTICAL ELEMENTS

BACKGROUND OF THE INVENTION

1. Field of the Invention

The present invention is directed to optical data transmission systems and, more particularly, to a parallel optical data transmission device which has an array of solid-state light-emitting elements, such as semiconductor lasers, mounted on the same substrate using a hybrid IC technology and transmits optical information signals in a parallel manner.

2. Description of the Related Art

The recent great increase in the quantity of information to be transmitted in a computer communication network makes those skilled in the art hesitate to conclude that the conventional (serial or parallel) electrical signal transmission lines provided among intercomputer communication machines are excellent transmission media whose transmission capability will still be satisfactory even in the future.

The optical transmission technology has been introduced to fulfill the demand of a greater amount of, and faster transmission of, intercomputer information signals. Basically, it is undeniable that the optical transmission technology is given an important role in the highly advanced computer communication network in light of its advantages, such as noninductiveness, wideband characteristic and high-speed transmission of the transmission lines. Those skilled in the art do not however believe that a single optical transmission line employed among the existing communication machines can sufficiently cope with transmission of high rate, digital optical information signals.

The key to overcome these problems is the parallel optical data transmission technology. Data communications among computer terminals, known as "workstations," are normally executed with digital data having a selected number of bits as a data unit, so that the parallel optical transmission scheme is just the "best casting." With the parallel optical transmission scheme, the signal transmission capacity and the signal transfer rate can be significantly increased; in addition, it is possible to in principle eliminate the need for extra circuit structures, such as parallel-to-serial converters and time-division multiplexing/demultiplexing devices, unlike in the case of serial transmission using a single transmission line path, and, at the same time, to minimize the total required buffer memory. This can reduce the burden on the hardware structure.

The parallel optical transmission technology, which is expected to be prosperous, actually has several unsettled issues. One of these issues is realization of perfect unification of effective wire lengths at the electric wiring portions of individual signal transmission channels. Another issue is to deal with reduction in effective signal margin caused by the inductive cross talk between adjoining electric signal transmission channels and/or ground potential noise and elimination of the non-uniform characteristic impedance. These shortcomings are hindering parallel optical transmission from being applied to computer communication systems, and there is a strong demand of promptly solving the problems.

SUMMARY OF THE INVENTION

It is therefore an object of the present invention to provide a new and improved parallel optical data transmission device which is excellent in its signal transfer characteristics.

In accordance with the above object, the present invention is addressed to a specific optical data transmission device which has first and second mutually spaced base plate portions having electrical signal terminals formed at predetermined intervals. An array of a preselected number of light-emitting elements are provided on the first base plate portion and are arranged at intervals smaller than the intervals of the signal terminals. An array of photosensitive devices equal in number to the light-emitting devices are provided on the second base plate portion and are arranged at intervals smaller than the intervals of the signal terminals. An optical coupling section is provided to optically couple the first and second base plate portions. The optical coupling section has parallel transmission lines for permitting independent transmission of optical signals between the light-emitting devices and the photosensitive devices. A transfer delay in the transmission of optical signals between the light-emitting devices and the photosensitive devices via the parallel transmission lines is compensated for by making the total electric transmission line lengths of the parallel transmission lines running through the electrical signal terminals, the light-emitting devices and the photosensitive devices essentially equal to one another.

The present invention, its objects and advantages will become more apparent from the detailed description of preferred embodiments presented below.

BRIEF DESCRIPTION OF THE DRAWINGS

In the detailed description of preferred embodiments of the present invention presented below, reference is made to the accompanying drawings of which:

FIG. 1 is a diagram schematically showing the structures of main portions of a parallel optical data transmission device in accordance with a preferred embodiment of the present invention;

FIG. 8 is a plan view of a semiconductor laser device with an optical output monitor in accordance with the third embodiment of the present invention;

FIG. 9 is a perspective view of the semiconductor laser device in FIG. 8;

FIG. 10 is a diagram schematically showing the cross-sectional structure of a mounting substrate along the line X—X in FIG. 8;

FIG. 11 is a plan view of a modification of the embodiment shown in FIG. 8; and

DETAILED DESCRIPTION OF THE PREFERRED EMBODIMENTS

Figure 2:
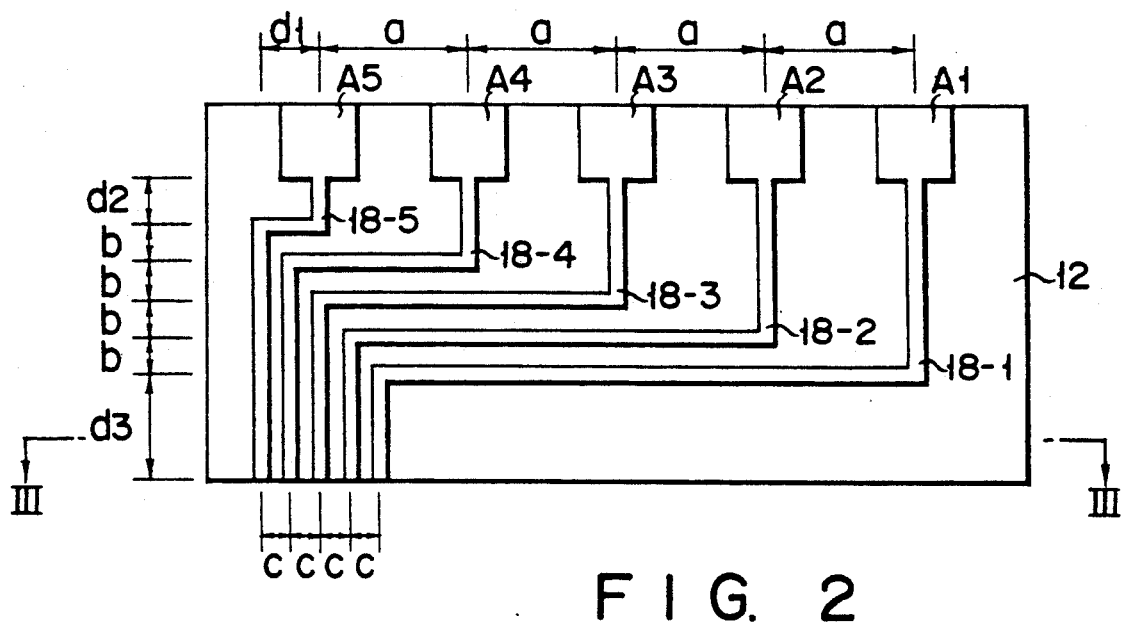
FIG. 2 is a diagram showing in enlargement a plan view of a optical transmission substrate in FIG. 1.

Referring to FIG. 1, a 5-channel arrayed optical data transmission device in accordance with one embodiment of the present invention is presented which performs parallel optical transmission. This "arrayed" optical data transmission device has an optical signal emitting unit 10, an optical reception unit 20 that is spatially distant from the unit 10, and a parallel optical transmission cable 30 provided therebetween.

As shown in FIG. 1, the optical signal emitting transmission unit 10 has an insulative substrate 12 to be coupled to an array of optical semiconductor elements 14 that emit light modulated to represent optical information signals. These elements 14 may be known types of light-emitting devices, such as light-emitting diodes, semiconductor laser devices, or the like, as will be explained in detail later. The optical reception unit 20 has an insulative substrate 22 to be coupled to an array of semiconductor photosensitive elements 24 that serve as "photodetectors" for detecting optical signals externally supplied thereto. These spatially separated substrates 12 and 22 are coupled with each other by means of the parallel optical transmission cable 30. The output optical signals of the light-emitting elements 14 are sent via the cable 30 to the semiconductor photosensitive elements 24 mounted on the substrate 22. Since this embodiment involves a 5-channel optical transmission, the optical cable 30 essentially consists of five parallel fibers bundled together.

The optical signals emitting substrate 12 is securely attached onto a plate 16 of high conductivity, which may be made of copper or aluminum. The plate 14 serves as a "heat discharger" of the optical signals emitting substrate 12; it also acts as a ground electrode. An array of the optical signals emitting elements 14 are securely mounted on the ground electrode plate 16.

As shown in FIG. 2, the optical signals emitting substrate 12 has signal input pads A1, A2, A3, A4 and A5 formed at the opposite edge portion. These signal input pads A are electrically connected on the substrate 12 to the optical signals emitting elements 14 by means of connection wires or lines 18-1, 18-2, 18-3, 18-4 and 18-5. With the electrical wiring arrangement, an electrical input signal externally supplied to each of the signal input pads—such as a laser drive signal representing information to be transmitted—is supplied to a corresponding element 14$i$, and then converted into a optical signal indicative of the information.

The other substrate, e.g., optical signals reception substrate 22, is similar in its arrangement to the optical signals emitting substrate 12. More specifically, the substrate 22 is attached onto a ground electrode plate 26, on which an array of the photodetector elements 24 are securely mounted. The substrate 22 has electrical signal output pads B1, B2, B3, B4 and B5 which are formed at the opposite edge portion; these pads B are electrically connected in a one-to-one correspondence manner to the photodetectors 24 by means of connection wires or lines 28-1, 28-2, 28-3, 28-4 and 28-5. Accordingly, optical signals transferred over the 5-channel optical transmission cable 30 from the light-emitting elements 14 are converted into electrical signals by corresponding photodetectors 24, then are supplied to the corresponding signal output pads B associated therewith.

Figure 3:
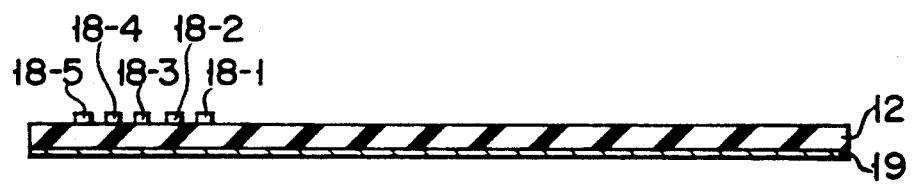
FIG. 3 is a diagram showing the cross-sectional view of the optical transmission substrate presented in FIG. 2 along the line III—III.

Typically, the optical signals emitting elements 14 may be GaInAsP/InP- or GaAlAs/GaAs-based light-emitting diodes (LEDs) or semiconductor lasers; the photodetectors 24 may be PIN photodiodes made of a semiconductor material corresponding to that of the elements 14. The optical transmission cable 30 may be optical fibers of quartz bundled in parallel at pitches of about 250 micrometers. As the insulative substrates 12 and 22, $Al_2O_3$ plates about 100 micrometers thick are used. The wiring on the substrates 12 and 22 including the signal input pads A and signal output pads B is made using a well-known patterning technique; for example, the pitches of the pads A and B are 0.5 to 2.5 millimeters and the pitches of the light-emitting devices 14 and the light-receiving devices 24 are 0.25 millimeter. The width of the lines 18 and 28 on the substrates may be 100 micrometers. The whole back of each of the substrates 12 and 22 is metallized with Au/Cu to have a thickness of 100 nanometers for each, as indicated by reference numeral "19" in FIG. 3, thus providing a microstrip line structure having a characteristic impedance of 50 ohms.

Attention should be paid to the arrangement of electrical/optical transmission lines of the 5-channel arrayed optical data transmission device—each of the signal transmission lines from the signal input pads A up to the signal output pads B is set completely equal to the remaining ones in terms of the effective line length.

More specifically, in the optical signals emitting unit 10, the wiring lines 18-1, 18-2, 18-3, 18-4, and 18-5 are bent in a stair-step shape with the lengths sequentially varying, in such a manner that the line 18-1 for the rightmost signal input pad A1 is the longest in terms of the signal transmission line length and that the line 18-5 for the leftmost signal input pad A5 is the shortest in terms of the total line length, as shown in FIG. 1. Quite contrary to this, wiring lines 28-1, 28-2, 28-3, 28-4, and 28-5 on the substrate 22 of the optical signals reception unit 20 are bent in a stair-step shape, with thin layers sequentially varying, in such a manner that the line 28-1 for the rightmost signal output pad B1 is the shortest and the line 28-5 of the leftmost signal output pad B5 is longest in terms of the total line length. As a result, the longest on-substrate transmission line 18-1 of the optical signals emitting unit 10 is associated with the shortest on-substrate transmission line 28-1 of the optical signals reception unit 20; while, the shortest transmission line 18-5 of the unit 10 is associated with the longest transmission line 28-5 of the other unit 20. Therefore, their total lengths of electrical transmission line paths become absolutely equal to one another and constant. In other words, the lengths of the effective transmission lines between the pads A as signal input terminals and the pads B as signal output terminals become completely equal to one another.

FIG. 2 presents a detailed illustration of the "sequentially lengths-varying stair-step bending" arrangement for the on-substrate transmission lines 18. In FIG. 2, the pitches between the signal input pads A1, A2, A3, A4 and A5 are indicated by "a," the pitches between the horizontal portions of the lines on the substrate by "b," and the line pitches at the connecting edge portions of the light-emitting devices by "c." With the distance between the center of the leftmost pad A5 and the vertical portion of its line being "d1," the distance between the lower edge of the pad A5 and the horizontal portion of the bent line 18-5 being "d2," and the distance between the connecting edge portion of the light-emitting devices of the substrate 12 and the horizontal portion of the rightmost pad A1 being "d3," the signal transmission line path lengths L1, L2, L3, L4 and L5 of the lines 18-1, 18-2, 18-3, 18-4 and 18-5 are expressed as follows:

$$
\begin{aligned}
L1 &= d1 + d2 + d3 + 4b + 4a - 4c \\
L2 &= d1 + d2 + d3 + 4b + 3a - 3c \\
L3 &= d1 + d2 + d3 + 4b + 2a - 2c \\
L4 &= d1 + d2 + d3 + 4b + a - c \\
L5 &= d1 + d2 + d3 + 4b
\end{aligned}
\quad (1)
$$

Though not specifically illustrated, the signal transmission line path lengths L1', L2', L3', L4' and L5' of the electrical lines 28-1, 28-2, 28-3, 28-4 and 28-5 of the optical reception unit 20 having the reverse "sequentially lengths-varying stair-step bending" arrangement are expressed as follows:

$$
\begin{aligned}
L1' &= d1 + d2 + d3 + 4b \\
L2' &= d1 + d2 + d3 + 4b + a - c \\
L3' &= d1 + d2 + d3 + 4b + 2a - 2c \\
L4' &= d1 + d2 + d3 + 4b + 3a - 3c \\
L5' &= d1 + d2 + d3 + 4b + 4a - 4c
\end{aligned}
\quad (2)
$$

For the sake of simplifying the equations, let us define:

$$d1 + d2 + d3 + 4b\,a = Lo \quad (3)$$

then the total signal line lengths of the individual lines become $$
\begin{aligned}
L1 + L1' &= 2Lo + 4a - 4c \\
L2 + L2' &= 2Lo + 4a - 4c \\
L3 + L3' &= 2Lo + 4a - 4c \\
L4 + L4' &= 2Lo + 4a - 4c \\
L5 + L5' &= 2Lo + 4a - 4c
\end{aligned}
\quad (4)
$$

which proves that all become the same.

When electrical signals of the same phase are input to the pads A1 to A5 of the optical signals emitting unit 10 at the same timing, their phases are slightly shifted sequentially in accordance with the difference in line path length among the lines 18-1 to 18-5 until these signals reach the light-emitting devices 14 on the substrate 12. These electric signals are converted into corresponding optical signals by the optical elements 14 while reflecting their phase shifts as they are. The phase-shifted optical signals are sent via the optical transmission cable 30 to the optical signals reception unit 20, and are then converted again by the photosensitive elements 24 serving as photodetectors to be "reconstructed" into the original electrical signals. The mutual phase shifting of the reconstructed electrical signals is automatically compensated for one-by-one by the "reverse phase shifting" while the signals are being transmitted through the lines 28-1 to 28-5 which are bent with the lengths sequentially varying, so that the signals have the exactly same phase when they reach the signal output pads B1 to B5.

This means that transmitting digital data signals using the parallel optical data transmission device according to this embodiment can compensate 100% for the distribution of the transfer speed for every data bit. As the bit delay during transfer can be suppressed, an extra circuit structure to cope with the signal delay is totally unnecessary, thus ensuring high-speed transmission of parallel information signals in a communication system with the smallest additional circuit structure.

In addition, according to this embodiment, cross talk between signals caused during transmission is quite unlikely to be superimposed on the transmitted signals, because the signal cross talk itself delays or advances with time for each of the transmission lines on the substrate. Such a shift of the cross talk itself brings about an unexpected advantage that permits data discrimination with a clock signal as a reference and elimination of a cross talk component of data preceding and following the discriminated data based thereon. it is therefore possible to improve the effective signal margin in parallel information transmission and significantly increase the transmission efficiency. This can contribute to improving the quality of transmission signals.

It should be noted that, according to the embodiment, the on-substrate wiring lines 18 and 28 are formed in a stair-step shape according to the concept of the "sequentially lengths-varying stair-step bending" arrangement; however, the shape is not restrictive to this type but may take a wave form or a linear track form without abandoning the basic concept of the present invention.

Figure 4:
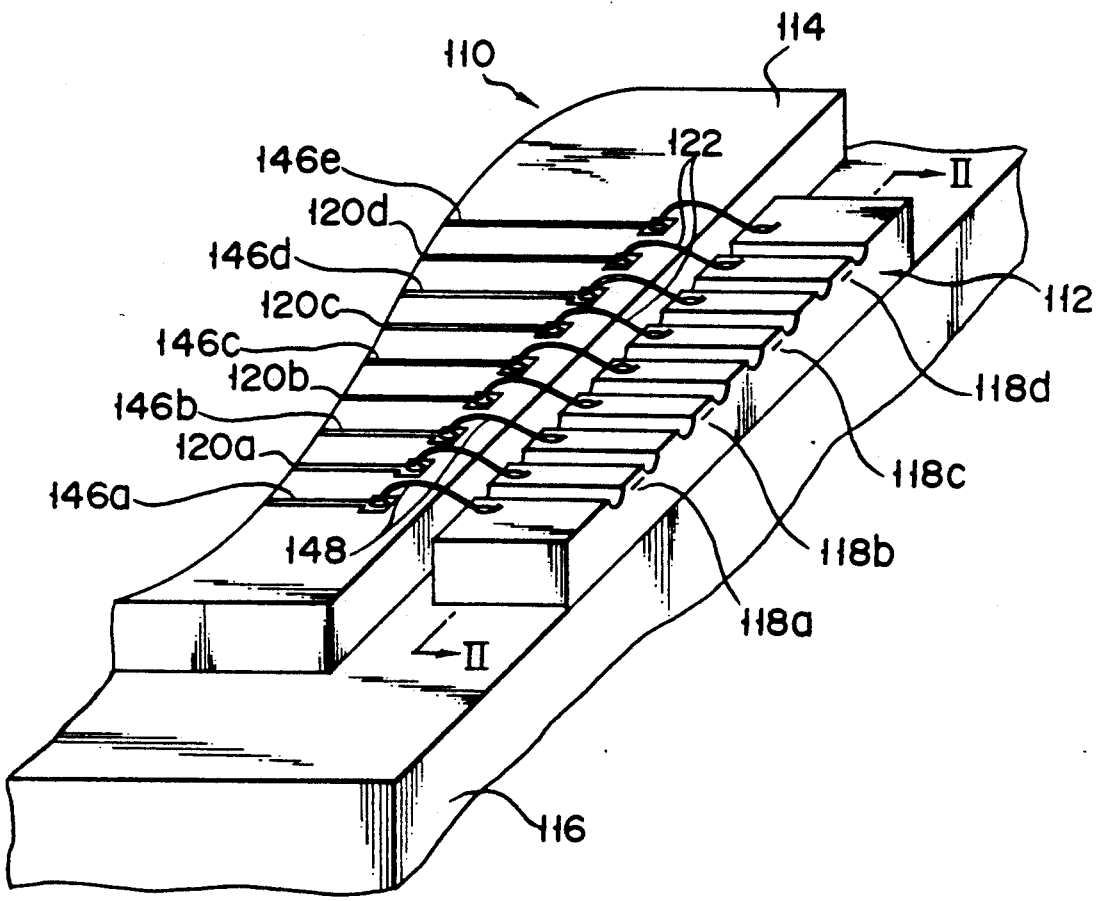
FIG. 4 is a diagram schematically showing a perspective view of the structures of main portions of a hybrid integrated device provided in a parallel optical data transmission device in accordance with the second embodiment of the present invention.

Turning now to FIG. 4, a hybrid semiconductor integrated device employed in a parallel optical data transmission device in accordance with the second embodiment of the present invention is generally designated by reference numeral "110." This hybrid integrated device 110 is an optical transmitter having an array type semiconductor laser section 112 and a transmission line path substrate 114, associated with a drive IC section (not visible in FIG. 4) of the laser section, both located on a mounting substrate 116. This device may be considered as the aforementioned optical signals emitting substrate 12 of the first embodiment having the arrayed light-emitting elements 14.

The mounting substrate 116 may be a ceramic plate of high heat-conductivity having a metallized surface or a metal plate; this substrate 116 will be called "mother board" or "main board" in the following description. A semiconductor laser section 112 is securely mounted on a certain edge section of the main board 116. The laser section 112 has a selected number of semiconductor laser devices 118 arranged in an array. According to the illustrated embodiment, four semiconductor lasers 118a, 118b, 118c and 118d are arranged in parallel so as to constitute a 4-channel array type laser section. Each of these semiconductor lasers 118 has a wire bonding contact face defined on its top. Each semiconductor laser 118i (i=a, b, c or d) is, for example, a semiconductor laser of a gallium-indium-arsenic-phosphorus/indium-phosphorus (hereinafter simply called "GaInAsP/InP") base.

On a drive-signals transmission line substrate 114, signal transmission lines 120a, 120b, 120c and 120d to be connected to a drive circuit (not shown) are formed in parallel by a patterning technique. These wiring lines 120 define square-shaped pad patterns at those portions which terminate at an edge portion of the substrate 114.

Figure 7:
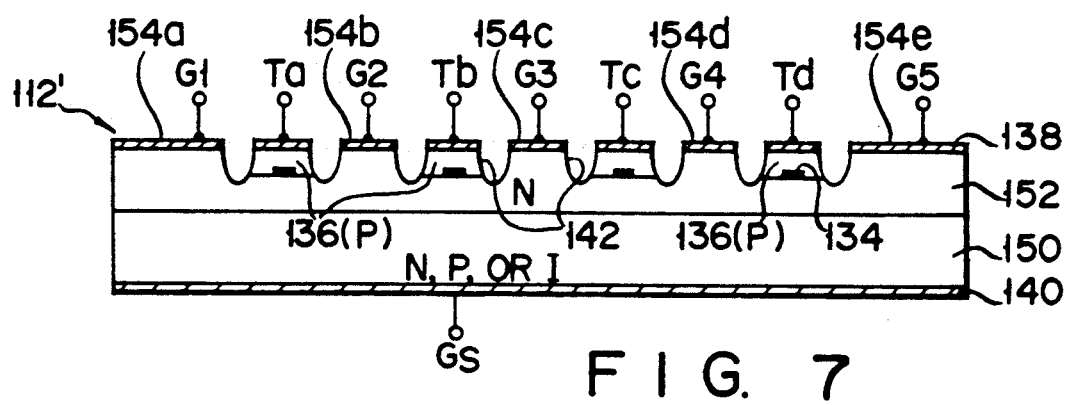
FIG. 7 is a diagram schematically showing the cross-sectional structure of a modification of the array type semiconductor laser section in FIG. 5.

As shown in FIG. 7, the 4-channel array type laser section 112 and the drive-signals transmission line substrate 114 therefor are arranged adjacent to each other, with a predetermined distance therebetween, on the main board 116. The distances or pitches between the semiconductor lasers 118 in the laser section 112 are substantially identical to the mutual distances between the drive-signals transmission lines 120 for the semiconductor laser devices.

Bonding wires 122 are provided to electrically connect the array type laser section 112 and the drivesignals transmission line substrate 114, thereby to permit signal exchange therebetween. More specifically, bonding wire 122$i$ (i=a, b, c,...) may be an ordieach nary wire with a diameter of 25 micrometers, made of gold, copper or aluminum. Each bonding wire 122 has one end pressure-bonded to the pad pattern end portion of a certain drive-signals transmission line 120$i$ by a known technique, and the other end likewise pressure-bonded to the corresponding semiconductor laser 118$i$ associated with this line 120$i$. The technique of bonding the bonding wires 122 may be heat-press bonding, ultrasonic bonding or both combined. The bonding wires 122 stably run in the air with approximately constant intervals while maintaining a constant arc shape upward known as "loop" among those skilled in the art.

As most clearly shown in FIG. 5, the array type laser section 112 has wire bonding regions of the ground lines, which are formed on the same side as the wire bonding tops, as will be described below in greater detail. The array type laser section 112 has an elongated rectangular-shaped InP substrate layer 130 of N type conductivity. An N type InP buffer layer 132, undoped GaInAsP active layers 134 and P type InP cladding layer 136 are sequentially laminated on the substrate layer 130. The active layers 134 are buried in a stripe shape by the cladding layer 136 by means of a well-known patterning process. A first metal layer 138 serving as a signal line electrode is formed on the top surface of the laser section 112, and a second metal layer 140 serving as a ground electrode is formed on the bottom surface of the laser section 112.

Parallel separation grooves 142 are formed at fixed intervals of a constant distance in the P type InP cladding layer 136 and signal line electrode layer 138. The separation grooves 142 are deep enough to penetrate the layers 138 and 136. The separation grooves 142 define the semiconductor laser portions 118$a$, 118$b$, 118$c$ and 118$d$, and ground line bonding portions 144$a$, 144$b$, 144$c$, 144$d$ and 144$e$, which do not have the active layers 134. These portions 118 will be called the "bonding mesa portions" hereinafter; they may also be called the "ground mesa portions," or "dummy mesa portions." The semiconductor laser sections 118 and the ground line bonding portions 144 are alternately arranged along the length of the laser substrate layer 130—this alternate array structure should be well understood referring to FIG. 7—thereby to provide the substrate-grounded type 4-channel array laser structure.

Figure 5:
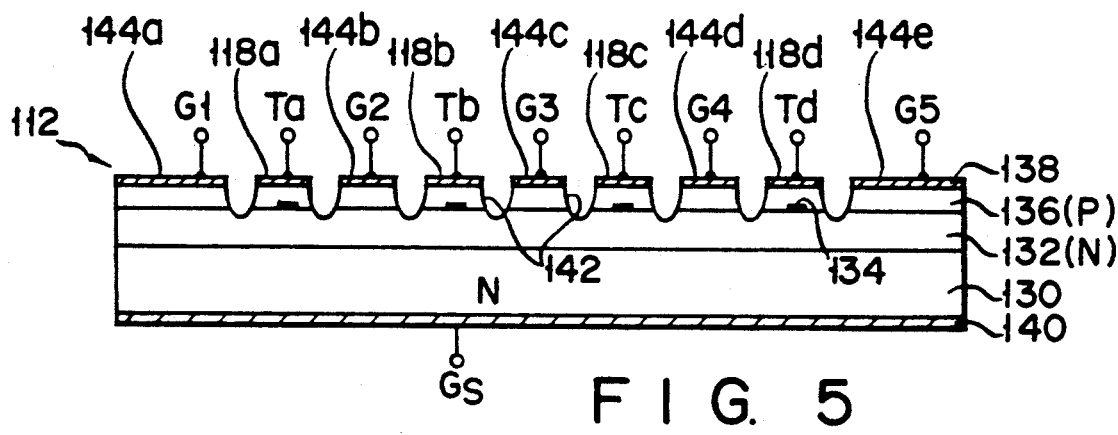
FIG. 5 is a diagram schematically showing the cross-sectional structure of an array type semiconductor laser section of the embodiment shown in FIG. 4, taken along the line V—V.

Referring to FIG. 5, the connection terminal of a substrate-grounded electrode layer 140 is indicated by "Gs." In this diagram, "Ta," "Tb," "Tc" and "Td" are used to represent drive signal supply terminals of the laser devices 118$a$, 118$b$, 118$c$ and 118$d$ of the 4-channel array laser section 112. The ground connection terminals of the bonding mesa portions 144$a$ to 144$e$ are denoted by "G1" through "G5," respectively.

Figure 6:
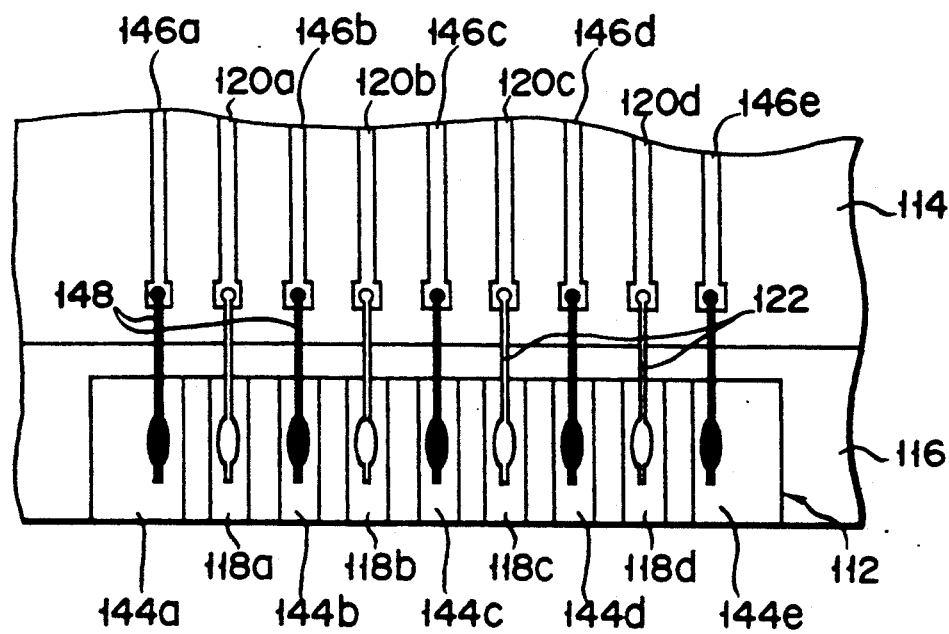
FIG. 6 is a diagram showing a plan view of the structure of a bonding wire connection between the array type semiconductor laser section and transmission line substrate shown in FIG. 4.

Ground lines 146$a$, 146$b$, 146$c$, 146$d$ and 146$e$ running in parallel are additionally formed on the top surface of the transmission line substrate 114 in association with the terminals G1 to G5. These ground lines 146 and the aforementioned drive-signals transmission lines 120$a$ to 120$d$ are alternately arranged, as shown in FIG. 6. In other words, each drive-signals transmission line 120$i$ is electrically and magnetically shielded on both sides by two ground lines 146 that are each neighboring thereto.

In addition to the bonding wires 122 for drive signals, ground connecting bonding wires 148 are provided in a similar manner. Each bonding wire 148 electrically connects a corresponding one of the ground mesa portions 144 and a ground line 146$i$ (i=a, b, c, d or e) on the transmission line substrate 114 associated with the line 120$i$. As a consequence, as shown in FIG. 6—in this diagram, the ground bonding wires 148 are marked black simply for the purpose of providing a visual distinction—each of the drive signals transmission bonding wires 122 is held on its both sides by two ground bonding wires 148 also in the "array" of bonding wires between the array type semiconductor laser section 112 and transmission line substrate 114; each bonding wire 122$i$ can therefore be electrically and magnetically shielded from the others, adjoining bonding wires 122.

The present inventors produced several samples of the actual device employing the above-described structure. The substrate of the array type semiconductor laser section 112 of one sample was approximately 250 micrometers long (i.e., the laser resonator length) and approximately 1200 micrometers wide. Eight separation grooves 142 of 25 micrometers wide were formed at equal intervals of about 100 micrometers, thereby defining the laser devices 118 of 100 micrometers wide and ground mesa portions (dummy mesa portions) 144 of 100 micrometers wide arranged alternately. In this case, it was proved that the additional ground wires 146 and the ground connecting bonding wires 148 well serve as shield lines or "electromagnetic barriers" for each transmission line 120 and its bonding wire 122 from the following fact. The DC component of the ground wires 146 was completely eliminated by the PN reverse bias junction at the N type layer 132 and P type layer 136, and only a slight AC component was coupled between the adjoining ground terminals G1, G2, . . . , G5 through the capacitor at the PN reverse bias junction.

The 4-channel array type laser section 112 having the substrate-groundled type structure as used in the above embodiment can be replaced with the one having a "substrate-insulating type" laser structure as shown in FIG. 7. In this case, the laser substrate layer is comprised of an InP layer 150 of N type, P type or I type (semi-insulative type). An N type InP buffer layer 152 is formed on this InP layer 150. Parallel separation grooves 142 are formed on the top surface of the InP buffer layer 152 as in the structure shown in FIG. 5, thereby defining alternately-arranged laser device regions (signal line mesa portions) 118$a$, 118$b$, 118$c$ and 8$d$ and ground mesa portions (dummy mesa portions) 154$a$, 154$b$, 154$c$, 154$d$ and 154$e$.

Buried in each laser device region 118 is an undoped GaInAsP active layer 134. As should be apparent from FIG. 7, P type InP cladding layers 136 are formed only in the laser device regions. The selective formation of these P type cladding layers 136 can be made by selective diffusion of P type impurities and selective growth of a P type InP or N type InP layer. The N type InP layer 152 may have the cross-sectional structure shown in FIG. 7 by forming the P type In layer 136, then selectively removing it. Step-like configurations produced in this case on the surface of the resultant structure are merely 1 or 2 micrometers high, which are practically insignificant. The other cross-sectional structures are substantially identical to those of the structure shown in FIG. 5.

It should be noted in FIG. 7 that the electrode layer 140 on the bottom side serves as a metal layer formed by metalization for securely connecting the array type laser section 112' on the main board 116, and that this metal layer may be electrically separated or insulated from the main board 116. Further, the electrical connection between the 4-channel array type laser section 112' having the substrate-insulating type structure shown in FIG. 7 and the transmission line path substrate 114 is basically the same as the one provided in the previous embodiment, and is made using the alternately-arranged drive-signal bonding wires 122 and ground connecting bonding wires 148.

The present inventors prepared some samples of the device having the array type laser section 112' in FIG. 7 mounted on the main board 116 and confirmed the effect of preventing "cross-talk" between adjoining channels as in the previous case. The array type semiconductor laser section 112' of one sample was made to have the aforementioned size. Given the bonding wires 122 and 148 are sufficiently longer than the wavelength of the electromagnetic wave, the characteristic impedance Zo of signal lines between the laser section 112' and the transmission line substrate 114 becomes approximately 550 ohms:

$$Zo = \frac{2\sqrt{\mu/\epsilon}}{\pi} \cdot \cosh^{-1}(S/d) \quad (5)$$

where
- $\mu$: permeability ($\mu \sim 4\pi \times 10^{-7}$ H/m in the air)
- $\epsilon$: dielectric constant ($\epsilon \sim (1/36)\pi) \times 10^{-9}$ F/m in the air)
- S: interval between bonding wires (laterally symmetrical)
- d: diameter of bonding wires (all the wires have the same diameter)
- $\cosh^{-1}$: arc hyperbolic trigonometric function.

Actually, when the sample device is provided with the bonding wire connection as shown in FIG. 6, the bonding wires are formed sufficiently shorter than the length of the electromagnetic wave, making the value of the characteristic impedance smaller than the computed value. It will therefore be recommendable for actual devices that a careful consideration be made in accordance with the wire length and the shape of the loop and that the optimal adjustment of the device size or the like be conducted when needed.

According to the above-described embodiments, in addition to the drive-signal bonding wires 122, the ground connection bonding wires 148 arranged alternately with respect to the former wires 122 are provided to the signal transmission lines between the array type laser section 112 or 112' and the transmission line substrate 114 mounted on the main board 116, whereby the wires of the ground line including the bonding wire connecting portion can substantially be rendered to completely "run in parallel" with the wires of the signal transmission lines. It is thus possible to reduce or eliminate the adverse affect of a variation in distance or interval between the signal line wires and ground surface of the mounting substrate at the electrical connection between the functional blocks of the hybrid integrated device on the signal transmission characteristic. As a result, the functional elements—or function blocks—can be made independent from one another while being freed from a consideration of deterioration of the characteristic, thus permitting free designing of the transmission lines. This can greatly contribute to making the best use of the original advantages of the hybrid integrated device.

Further, according to the above embodiments, the additional ground connection bonding wires 148 can successfully provide electromagnetic shielding of each drive-signal bonding wire 122. This can minimize the unbalanced impedance likely to occur at the electrical connecting portions between the hybrid integrated functional devices and/or the generation of cross talk between channels in the array type light-emitting device. As a consequence, it is possible to significantly improve the high-frequency signal transmission performance in a frequency band of several gigahertz. Manufacturers of hybrid integrated devices should be very happy to know that the above technical advantages can be obtained without any inconvenience, such as complication of the structure or adverse influence on the manufacturing process.

A semiconductor laser device which is preferably used in a parallel optical data transmission system is illustrated in FIG. 8 as the third embodiment of the present invention; this laser device is generally designated by reference numeral "210." The semiconductor laser device 210 is used as one-channel optical signal generating unit with an optical output monitor, which is the most basic structure. The optical output monitor is necessary in order to provide an abnormal status detection for either an output-level variation compensating electric feedback control or a prevention of device deterioration. A photodiode acting as the detection element therefor is provided in the semiconductor laser device 210. With this embodiment, an optimized electrical signal transmission line path for a optical signal emitting laser and a laser-output monitoring photodiode is provided which is never "interfered" with an optical coupling line paths between the laser and the photodiode, as will be described in detail hereinafter.

As shown in FIG. 8, the semiconductor laser device 210 has an insulative substrate 212. The substrate 212 is securely mounted on a highly-conductive plate 214, which is made of, for example, a high heat-conductive metallized ceramic plate or a copper plate. The plate 214 serves as a heat-discharging member for the substrate 212; simultaneously, it acts as a ground electrode. A semiconductor laser 216 and monitoring photodiode 218 are stably mounted on the heat-discharging plate 214, as illustrated. The whole back surface of the substrate 212 is metallized to form a ground electrode layer 220, as shown in FIG. 9.

The substrate 212 has an electrical transmission line 224 of, for example, a linear shape, on its insulative top surface. The transmission line 224 is connected at one end to a signal input terminal 226, and connected at the other end thereof to the laser 216 by means of a bonding wire 228. The characteristic impedance of the transmission line 224 is adjusted to be 50 ohms in cooperation with the metallized ground layer 220, thus suppressing the undesired power reflection at the coupling section of the transmission line 224. When an electrical laser drive signal is externally supplied to the terminal 226, this signal is sent via the signal transmission line 224 and bonding wire 228 to the laser device 21. In response to the drive signal, the laser device 216 produces an optical information signal. In other words, the electrical information signal input to the terminal 226 is converted into a corresponding optical information signal 230, which is in turn sent out to, for example, an optical transmission cable (not shown in FIGS. 8 and 9) coupled to the terminal 226.

As shown in FIG. 10, the laser-connecting end portion of the substrate 212 has an inclined face 238 with a predetermined angle of $\theta$ in order to prevent a so-called "near-end reflection." In general, when the semiconductor laser 216 is applied with an external reflection component of the light being emitted by itself, it creates a state in which a composite resonance mode mixed and thus produces the undesired phenomenon, such as fluctuation of the optical output or generation of excess noise. The inclination angle $\theta$ should be determined in careful consideration of the optical coupling efficiency, and is set to a specific value that can best prevent the near-end reflection. In our samples, the inclination angle $\theta$ was selected to be 15° with the interval between the laser device 216 and the end of the line 224 set to 300 micrometers.

The laser-output monitoring photodiode 218 located away from the laser device 216 on the heat-discharging plate 214 is optically coupled with the laser 216 by an optical transmission line 232 functioning as an optical waveguide running inside the insulative substrate 212. As clearly illustrated in FIGS. 8 and 9, this optical transmission line 232 consists of a part overlapping the electrical transmission line 224 and a bent part subsequent therefrom. A part of output light of the laser device 216 is led through the optical transmission line 232 along the direction of the arrow 234 to enter the monitoring photodiode 218. The photodiode 218 has a monitor output terminal 236 where an electrical monitor signal Sm representing the amount of the monitored output light appears.

With the laser/monitoring-diode mounting substrate 212 having the electrical transmission line 224 and the optical transmission line 232, it is possible to minimize the length of the connecting boding wire 228 used for the semiconductor laser device 216. The minimization of the bonding wire's length can well eliminate obstructions, such as reduction in signal converting efficiency and/or deterioration of the high-frequency signal waveform originating from a variation in inductance involved in the transmission of high-frequency signals or mismatching of the characteristic impedance. As a result, it is possible to improve the performance of transmitting high-frequency signals in the parallel optical data transmission device. According to our samples, for instance, the length of the laser-connecting bonding wire 228 could be set in a range of 200 to 300 micrometers, and the allowable high frequency band in this case could be improved to 10 gigahertz or greater.

Furthermore, with the above arrangement, the optical coupling between the laser 216 and laser-output monitoring photodiode 218 is made exclusively by the optical transmission line 232, and no bonding wires are involved therein; this can reduce the spatial area occupied by or required for the optical coupling, particularly, the lateral width required. Such reduction in the occupying area can progress application of a laser device to a parallel optical data transmission system having a multi-channel structure, like the previous embodiments, as well as can enhance the efficiency of monitoring the optical output.

The following is a representative of our samples. The semiconductor laser device 216 is a GaInAsP/InP laser and its oscillation wavelength is approximately 1.3 micrometers. The photodiode 218, which was a PIN diode of the same material base, GaInAs/InP, monitors the average value of a laser light signal. The insulative substrate 212 is a $SiO_5$ plate 5 millimeters long along the line 224 and 150 micrometers thick; the heat-discharging substrate 214 was a 5-millimeter thick copper plate which had its surface gold-plated about 2 micrometers. The laser device 216 and diode 218 were mounted on the substrate 214 through a heat sealing sequentially using an AuSi eutectic alloy and an AuSn eutectic alloy.

The electric signal transmission line 224 formed on the $SiO_2$ substrate 212 is a microstrip line, such as Au/Cr or Au/Pt/Ti, 3 to 5 micrometers thick and 250 micrometers wide, and exhibited a transmission line impedance of 50 ohms in forming the ground electrode layer 220 on the back of the substrate 220. The transmission line 224 and the laser device 216 were electrically connected by the bonding wire 228 having diameter of 25 micrometers and a length of 300 micrometers. The signal input terminal 226 of the microstrip transmission line 224 was formed by pressure-bonding the conductor of the core of a connector for a coaxial cable.

The optical transmission line 232 was formed by doping, for example, 20% of an additive, such as $GeO_2$ or $P_2O_5$, in the $SiO_2$ substrate 212 and locally increasing the substrate reflection factor of the transmission line region. The resultant optical transmission line was measured to be 50 micrometers deep from the top surface of the $SiO_2$ substrate 212, 20$b$ micrometers thick and 50 micrometers wide. The light receiving angle was 30°. The center curvature of the bent portion was 1 millimeter, and the distance overlapping the microstrip transmission line 224 was 800 micrometers. This sample had a small optical waveguide loss of 2 to 3 dB as a whole and showed a good optical-output monitoring performance. With the normal semiconductor laser 216 having a thickness of about 100 micrometers, when the diode 218 was mounted on the same surface, the height of the optical waveguide 232 with respect to the laser emitting end was well controlled.

The embodiment presented in FIGS. 8 through 10 may be modified as illustrated in FIG. 11. In FIG. 11, the same reference numerals as used for the constituents in FIG. 8 are used to denote the identical or corresponding elements, thus omitting their description for the sake of descriptive simplification.

According to the modification shown in FIG. 11, an optical fiber 250 serving as an optical transmission line i employed in place of the buried waveguide 232 shown in FIG. 8. The optical fiber 250, which is buried in the insulative mounting substrate 212, typically has an outer diameter of 125 micrometers, a core diameter of 50 micrometers and a light-receiving angle of 25°. In this case, the substrate 212 may be an $SiO_2$ plate or $Al_2O_3$ plate. This arrangement requires no additive doping step for forming the buried optical waveguide and eliminates the need for a permeable material for the dielectric substrate 212, thus relaxing the manufacturing conditions and reducing the manufacturing cost. Accordingly, the applicability of the present invention can be expanded.

Figure 12:
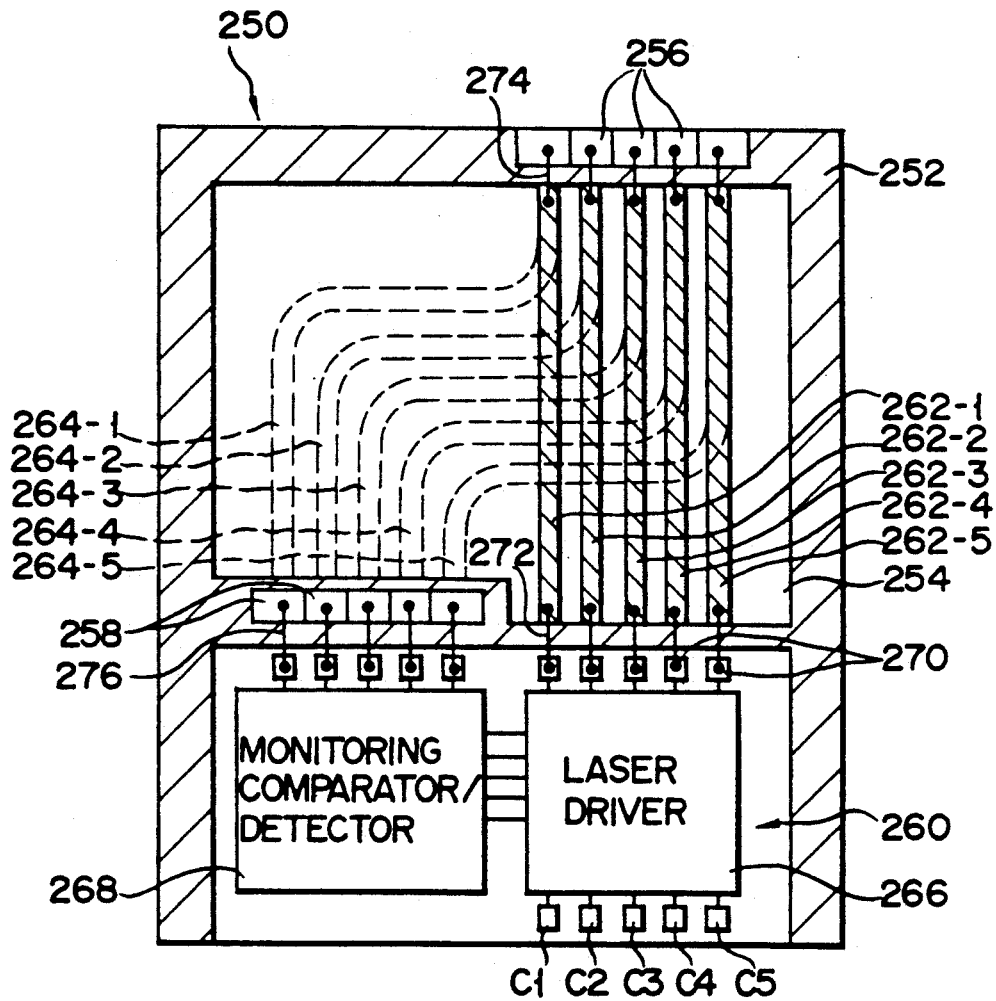
FIG. 12 is a plan view of a multi-channel semiconductor laser device with an optical output monitor in accordance with the fourth embodiment.

Referring to FIG. 12 a semiconductor laser device for use in a multi-channel parallel optical data transmission device is designated by reference numeral "250," which can be considered as the previous laser device 210 developed have a multi-channel structure. Mounted on a heat-discharging substrate 252 are an array of semiconductor laser 256, an array of photodiodes 258 and a laser driving IC 260. On an insulative substrate 254 are formed five parallel-running electrical transmission lines 262-1, 262-2, 262-3, 262-4 and 262-5. These signal transmission lines 262 provide electrical connection between the semiconductor laser array 256 and the laser driving IC 260. Formed in the insulative substrate 254 ar five bending optical transmission lines 264-1, 264-2, 264-3, 264-4 and 264-5 as buried optical waveguides for optically coupling the semiconductor laser array 256 to the optical-output monitoring diode array 258. The laser devices 256 are arranged at equal intervals of 500 micrometers. Likewise, the monitoring photodiodes 258 are arranged at equal intervals of 500 micrometers.

As shown in FIG. 12, the laser driving IC 260 has a driver 266 and an laser-output monitoring comparator/detector 268 electrically associated with each other. The driver 266 has signal input pads C1, C2, C3, C4 and C5 at one end and connection pads 270 at the opposite end. Each of the electrical transmission lines on the insulative substrate 254 has one end connected to a corresponding connection pad 270 by a bonding wire 272, and has the other end connected to a corresponding laser device 256 by a bonding wire 274. Accordingly, in a channel C1, for example, the drive signal is sent to a corresponding one of the laser devices 256 via the transmission line 262-1 and the bonding wires provided thereto, and light is emitted from this laser device.

The semiconductor laser 256 are optically coupled independently to the laser-output monitoring diodes 25 via the optical transmission lines or the buried waveguides 264-1, 264-2, 264-3, 264-4 and 264-5, respectively. Part of the optical output of each laser 256 is therefore led into an associated one of the monitoring diodes 258 by a corresponding buried waveguide 264-i. Since the diodes 258 are electrically connected to connection pads 276 of the monitoring comparator/detector circuit section 268 by the bonding wires 274, electrical light-monitoring signals are transferred to the circuit section 268.

According to this embodiment, in addition to the above-described technical advantages, highest-density devices and circuits can be mounted on the smallest substrate. Actually, the intervals between the laser devices 256, diodes 258 and electrical/optical transmission lines 262 and 264 may well be set to 300 micrometers or below; in this case, a laser transmission device with the minimum power dissipation, a high speed and the maximum efficiency can be realized.

What is claimed is:

1. An optical transmission device comprising:
   spaced-apart first and second base plate means having electrical signal terminals arranged at first selected intervals;
   an array of a plurality of light-emitting means provided on said first base means and arranged at second intervals which are smaller than said first intervals;
   an array of photodetective means being equal in number to said light-emitting means, provided on said second base plate means and arranged at same second intervals;
   optical coupling means for optically coupling said first and second base plate means, said optical coupling means having parallel transmission lines of substantially the same line length which allow independent transmission of optical signals between said light-emitting means and said photosensitive means;
   delay composition means for compensating for a delay in transmission of optical signals between said light-emitting means and said photodetective means by way of said parallel transmission lines;
   said delay compensation means including electrrical line-path length equalizer means for making total lengths of electric transmission line paths of said parallel transmission lines, which run through said electrical signal terminals, said light-emitting means and said photodetective means, substantially equal to one another, including
   said first base plate means having a plurality of first parallel electrical signal transmission lines of varying lengths, and said second base plate means having a plurality of second parallel electrical signal transmission lines of varying lengths, wherein a total length of any one of the first lines and a corresponding one of the second lines is substantially constant.

2. The device according to claim 1, wherein said first and second electrical signal transmission lines comprise:
   first wiring lines provided on said first base plate means and defining a predetermined pattern which provides sequentially different electrical connection line lengths between said electrical signal terminals formed on said first base plate means and said light-emitting means; and
   second wiring lines provided on said second base plate means for electrically connecting said photodetective means and said electrical signal terminals formed on said second base plate means in mutually different lengths, said second wiring lines defining an inverted pattern which corresponds to a reversed version of said pattern of said first wiring lines.

3. The device according to claim 2, wherein said patterns of each of said first and second wiring lines are shaped to make phase shifts between electrical signals being transferred along said parallel transmission lines equal to on another.

4. The device according to claim 3, wherein each of said first and second wiring lines is bent at least once.

5. The device according to claim 4, wherein said second wiring lines are bent in a direction opposite that of said first wiring lines.

6. The device according to claim 5, wherein said first wiring lines are bent with a same curvature by a same number of times, while said second wiring lines are bent with a same curvature by a same number of times.

7. The device according to claim 1, further comprising:
   first bonding wires for electrically connecting said first wiring lines to said light-emitting means, respectively;
   ground wiring lines provided on said first base plate means and alternately arranged between said first wiring lines;

grounded mesa portions without active layers, said portions alternately arranged between said light-emitting means; and second bonding wires for electrically connecting said ground wires to said grounded mesa portions, respectively.

8. The device according to claim 7, wherein said second bonding wires are substantially equal in bending shape to said first bonding wires.

9. The device according to claim 1, further comprising:

a photosensitive monitoring means associated with at least one of said light-emitting means; and optical waveguide means, defined in said first base plate means, for partially guiding an optical output of the corresponding light-emitting means to said monitoring means.

10. The device according to claim 9, wherein said optical waveguide means extends in such a way as to at least partially overlap a corresponding one of said first wiring lines.

11. The device according to claim 10, wherein a respective optical waveguide means is provided for each of said light-emitting means.

* * * * *